US012685127B2

(12) United States Patent
Xie et al.

(10) Patent No.: US 12,685,127 B2
(45) Date of Patent: Jul. 14, 2026

(54) METHOD AND STRUCTURE OF FORMING BARRIER-LESS SKIP VIA WITH SUBTRACTIVE METAL PATTERNING

(71) Applicant: INTERNATIONAL BUSINESS MACHINES CORPORATION, Armonk, NY (US)

(72) Inventors: Ruilong Xie, Niskayuna, NY (US); Nicholas Anthony Lanzillo, Wynantskill, NY (US); Huai Huang, Clifton Park, NY (US); Hosadurga Shobha, Niskayuna, NY (US); Lawrence A. Clevenger, Saratoga Springs, NY (US); Brent A Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 18/054,187

(22) Filed: Nov. 10, 2022

(65) Prior Publication Data

US 2024/0162139 A1 May 16, 2024

(51) Int. Cl.
| | |
|---|---|
| *H01L 23/522* | (2006.01) |
| *H10W 20/00* | (2026.01) |
| *H10W 20/20* | (2026.01) |
| *H10W 20/41* | (2026.01) |
| *H10W 20/42* | (2026.01) |
| *H10W 20/44* | (2026.01) |

(52) U.S. Cl.
CPC ......... *H10W 20/42* (2026.01); *H10W 20/082* (2026.01); *H10W 20/20* (2026.01); *H10W 20/435* (2026.01); *H10W 20/4403* (2026.01)

(58) Field of Classification Search
CPC ........... H01L 23/5226; H01L 21/76804; H01L 23/481; H01L 23/5283; H01L 23/53209; H01L 21/76897
See application file for complete search history.

(56) References Cited

U.S. PATENT DOCUMENTS

| | | | | |
|---|---|---|---|---|
| 9,502,350 | B1 * | 11/2016 | Bonilla | ............. H01L 23/53228 |
| 9,613,861 | B2 | 4/2017 | Anderson | |
| 9,805,972 | B1 | 10/2017 | Zhang | |
| 10,020,254 | B1 | 7/2018 | Bao | |
| 10,026,687 | B1 | 7/2018 | Lin | |

(Continued)

FOREIGN PATENT DOCUMENTS

EP          3979303 A1     4/2022

OTHER PUBLICATIONS

Radamson et al., "State of the art and Future Perspectives in Advanced CMOS Technology", nanomaterials 2020, 10, 1555, Published Aug. 7, 2020, 86 pages.

(Continued)

*Primary Examiner* — Karen Kusumakar
(74) *Attorney, Agent, or Firm* — Samuel A. Waldbaum

(57) ABSTRACT

A microelectronic structure including a first metal line, a second metal line, and a third metal line. A skip-via connecting the first metal line to the third metal line, where the skip-via includes a bottom section and a top section. A bottom sidewall of the bottom section is at a first angle and a top sidewall of the top section are at a second angle, where the first angle and the second angle are opposite from each other.

20 Claims, 10 Drawing Sheets

(56)                References Cited

U.S. PATENT DOCUMENTS

| | | | |
|---|---|---|---|
| 10,283,407 | B2 | 5/2019 | Chi |
| 2019/0021176 | A1 | 1/2019 | Law |
| 2019/0221473 | A1 | 7/2019 | Zhang |
| 2020/0135640 | A1 | 4/2020 | Sio |
| 2020/0243379 | A1 | 7/2020 | Motoyama |
| 2021/0125862 | A1 | 4/2021 | Zhu |
| 2023/0163064 | A1* | 5/2023 | Mukesh ............ H01L 21/76804<br>257/774 |
| 2023/0178474 | A1* | 6/2023 | Bhosale .............. H01L 23/5226<br>257/774 |

OTHER PUBLICATIONS

Zhao, "Advanced Interconnect Systems for ULSI Technology", 1998 IEEE, pp. 43-46.

\* cited by examiner

METHOD AND STRUCTURE OF FORMING BARRIER-LESS SKIP VIA WITH SUBTRACTIVE METAL PATTERNING

BACKGROUND

The present invention generally relates to the field of microelectronic, and more particularly to formation of a barrier-less skip via.

Nanosheet is the lead device architecture in continuing CMOS scaling. However, nanosheet technology has shown issues when scaling down such that as the devices become smaller and closer together, they are interfering with each other. Skip-via(s) are typically formed with a liner that is located on the outside surface of the skip-via, where the liner is located between the skip-via and the surrounding material. The liner causes the vertical resistance of the skip-via to increase.

BRIEF SUMMARY

Additional aspects and/or advantages will be set forth in part in the description which follows and, in part, will be apparent from the description, or may be learned by practice of the invention.

A microelectronic structure including a first metal line, a second metal line, and a third metal line. A skip-via connecting the first metal line to the third metal line, where the skip-via includes a bottom section and a top section. A bottom sidewall of the bottom section is at a first angle and a top sidewall of the top section are at a second angle, where the first angle and the second angle are opposite from each other.

A microelectronic device including a first metal line, a second metal line, and a third metal line. A skip-via connecting the first metal line to the third metal line, where the skip-via includes a bottom section and a top section. A bottom sidewall of the bottom section is at a first angle and a top sidewall of the top section are at a second angle, where the first angle and the second angle are opposite from each other. A liner located between the third metal line and the top section of the skip via.

A method including the step of forming a first metal line. Forming a second metal layer and patterning the second metal layer to form a second metal line and a skip-via and forming a third metal line. The skip-via connects the first metal line to the third metal line, where the skip-via includes a bottom section and a top section. A bottom sidewall of the bottom section is at a first angle and a top sidewall of the top section are at a second angle, where the first angle and the second angle are opposite from each other.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
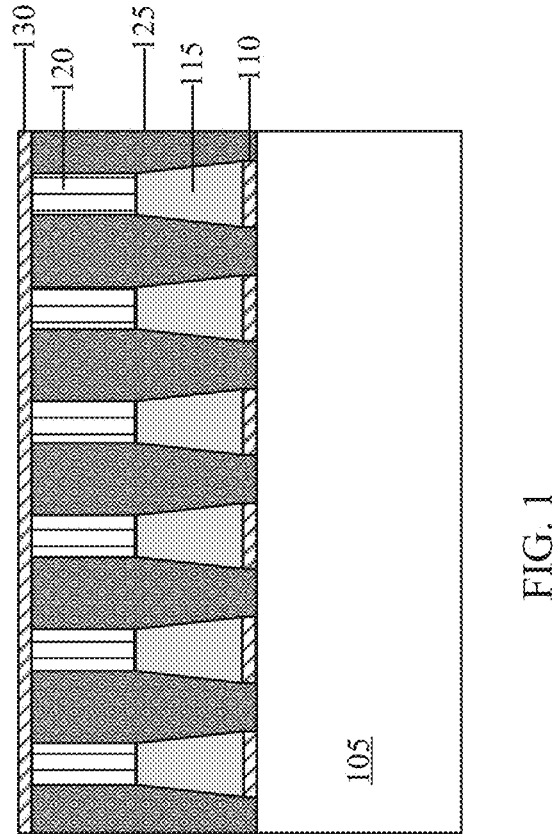
FIG. 1 illustrates a cross-sectional view across multiple first metal lines, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed to the formation of a skip-via without having a liner present between the sidewall of the skip-via and the surrounding material. The skip-via is formed through a multistage process where the bottom section of the skip-via is formed separately from the top section of the skip-via. The sidewalls of the bottom section of the skip-via are angled so that the width of the bottom section skip-via changes. The width of the skip-via increases from the bottom surface of the skip-via to a top surface of the bottom section of the skip-via. The sidewalls of the skip-via of the bottom section are angled away from a center vertical line of the skip-via. The top section of the skip-via extends vertically from the bottom section, where the sidewalls of the top section of the skip-via are angled. The width of the top section of the skip-via decreases as the top section extends vertically from where the top section meets the bottom section. Such that width of the top section of the skip-via decreases from the bottom surface to a top surface of the top section of the skip-via. The sidewalls of the skip-via are angled towards the center vertical line of the skip-via along the vertical height of the top section. The sidewalls of the bottom section are angled in an opposite direction than the angled of the sidewalls of the top section of the skip-via. The combined shape of the skip-via (i.e., the bottom section and the top section) has a diamond shape.

FIG. 1 illustrates a cross-sectional view across multiple first metal lines, in accordance with the embodiment of the present invention. A first metal adhesion layer 110 is formed on top of an underlying device/interconnect 105 and a first metal layer is formed on top of the first adhesion layer 110. A first hardmask 120 is formed on top of the first metal layer. The first metal layer and the first adhesion layer 110 are patterned to form a plurality of first metal lines 115. A first interlayer dielectric layer 125 is formed between each of the first metal lines 115. A second metal adhesion layer 130 is formed on top of the first interlayer dielectric layer 125 and on top of the first hardmask 120. The first and second metal adhesion layer (110 and 130) can be comprised of, for example, TiN, TaN, etc. The first metal lines 115 can be comprised of, for example, Ru, W, Co, etc. The hardmask 120 can be comprised of, for example, $SiO_x$, $SiN_x$, $AlN_x$, $AlO_x$, SiC, SiCO, etc. The interlayer dielectric layer 125 can be comprised of, for example, any low-k dielectric (with k value <4), note that a thin dielectric liner (such as SiN) can be deposited before low-k dielectric deposition.

Figure 2:
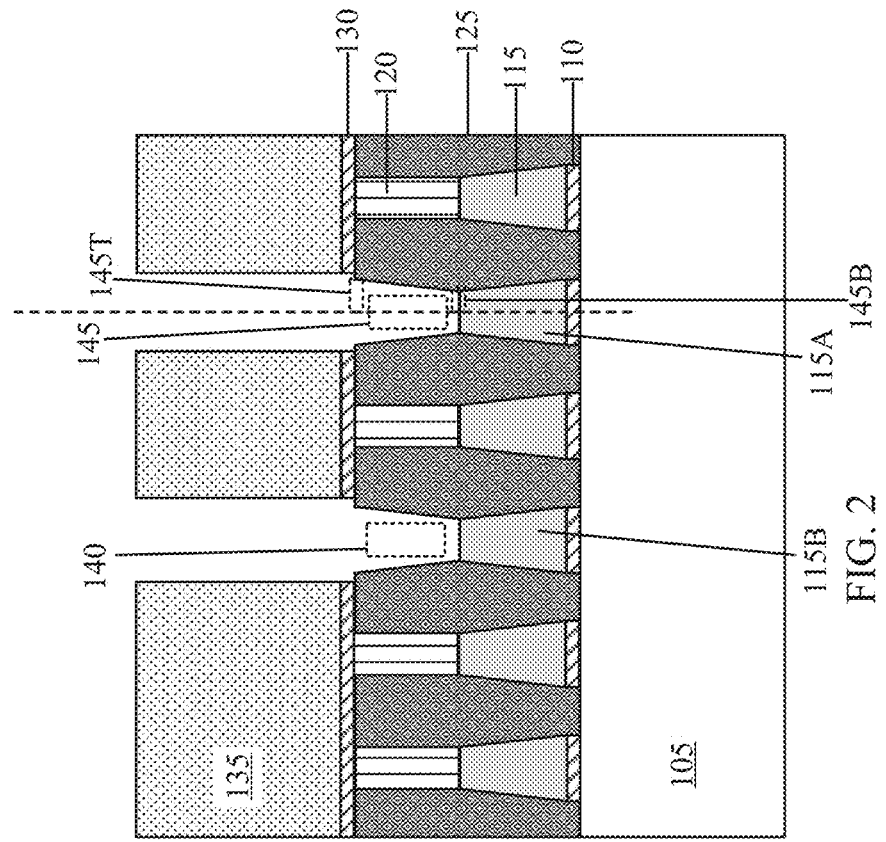
FIG. 2 illustrates a cross section view of the first metal lines after the formation of first trench, in accordance with the embodiment of the present invention.

FIG. 2 illustrates a cross section view of the first metal lines after the formation of first via openings 140, 145, in accordance with the embodiment of the present invention. A lithography layer 135, for example, an optical planarization layer, is formed on top of the second adhesion layer 130. The lithography layer 135 is patterned to form a plurality of first via openings 140, 145 in the first interlayer dielectric layer 125. Each of the plurality of first via openings 140, 145 exposes a top surface of one of the first metal lines 115, respectively. The sidewalls of the first via openings 140, 145 are angled, such that the top of the sidewalls is angled away from a center vertical line of the first via openings 140, 145 and the bottom of the sidewalls is angled towards the center vertical line (as illustrated by the vertical dashed line in FIG. 2). The bottom section 145B of the first via opening 145 has a first width when measured from the center of the first via opening 145 to the sidewall. The top section 145T of the first via opening 145 has a second width when measured from the center of the first via opening 145 to the sidewall. The second width is larger than the first width.

Figure 3:
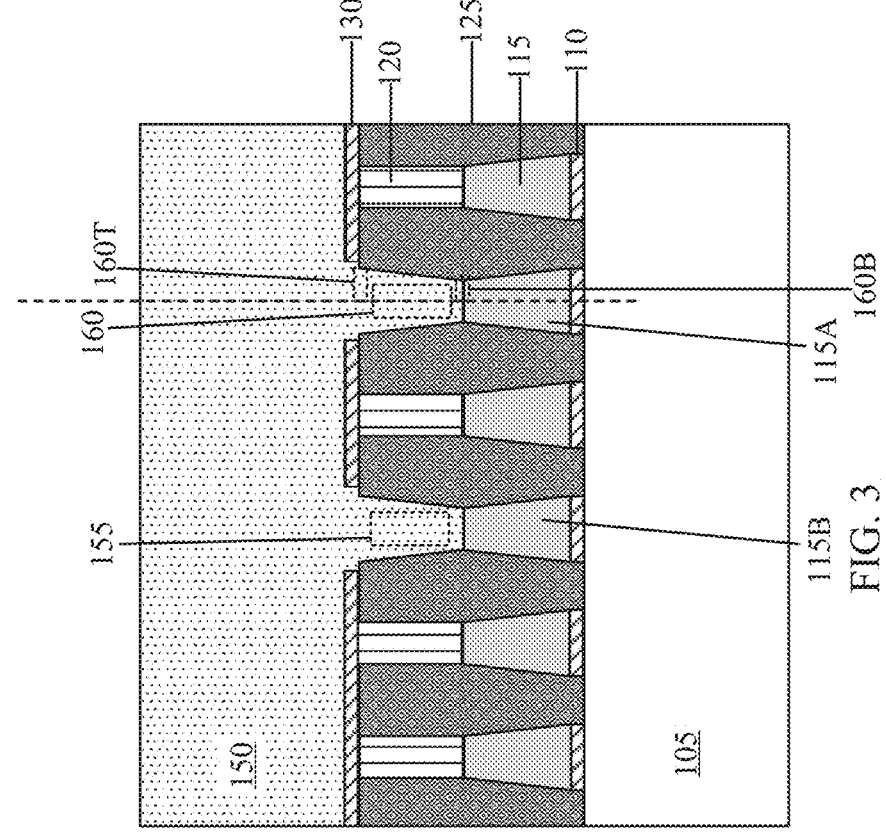
FIG. 3 illustrates a cross section view after the formation of a second metal layer, in accordance with the embodiment of the present invention.

FIG. 3 illustrates a cross section after the formation of a second metal layer 150, in accordance with the embodiment of the present invention. A second metal layer 150 is formed on top of the second adhesion layer 130 and fills each of the plurality of first via openings 140, 145. Dashed box 155 represents the section of the second metal layer 150 that fills the first via opening 140. Dashed box 160 represents the section of the second metal layer 150 that fills the first via opening 145, where dash box 160 represents the bottom section of the skip-via, hereinafter dash box 160 will be referred to as bottom section 160 of the skip-via. The bottom section 160 of the skip-via has a bottom surface in contact with the first metal lines 115. A bottom section 160B of the bottom section 160 of the skip via has a third width when measured from the center of the bottom section 160 to the sidewall. The third width is substantially equal to first width. The top section 160T of the bottom section 160 of the skip-via has a fourth width when measured from the center of the bottom section 160 of the skip-via to the sidewall. The fourth width is substantially equal to the second width. The fourth width is larger than the third width. The varying width of the bottom section 160 of the skip-via is achieved by the angled sidewalls, such that angle of the sidewall is away from the center line of the skip-via as the sidewall extends up bottom section 160B to the top section 160T of the bottom section 160 of the skip via.

Figure 4:
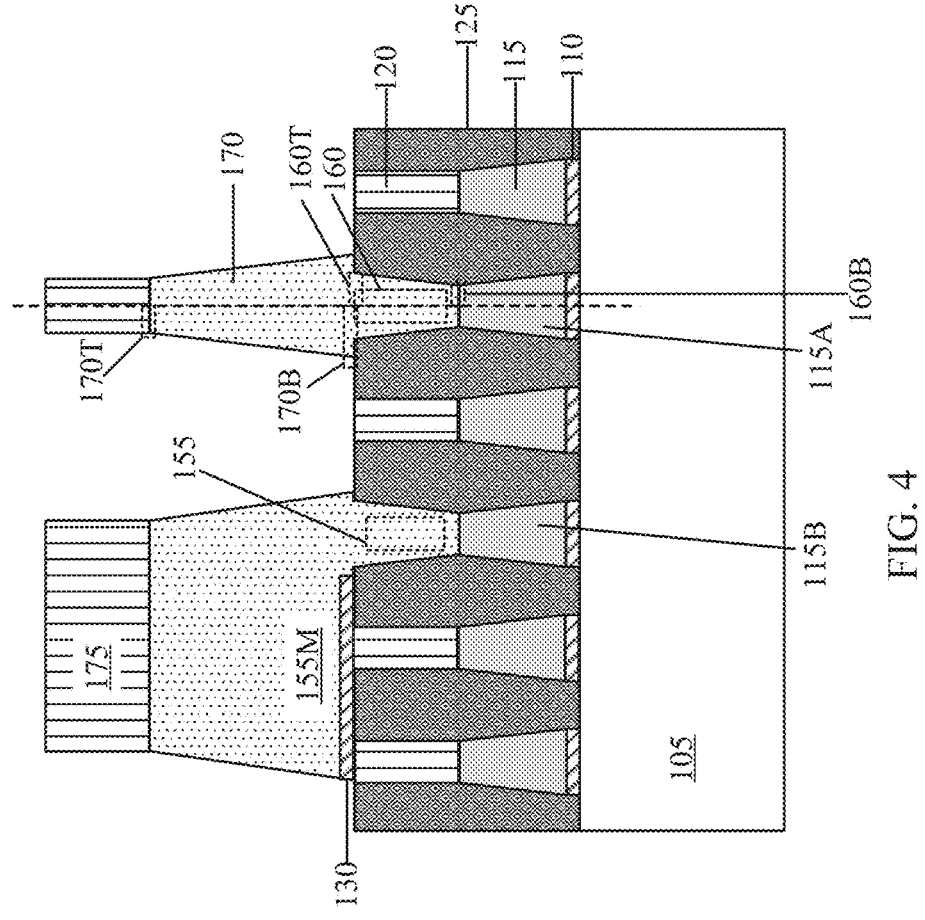
FIG. 4 illustrates a cross section view after an initial patterning of the second metal layer, in accordance with the embodiment of the present invention.
Figure 8:
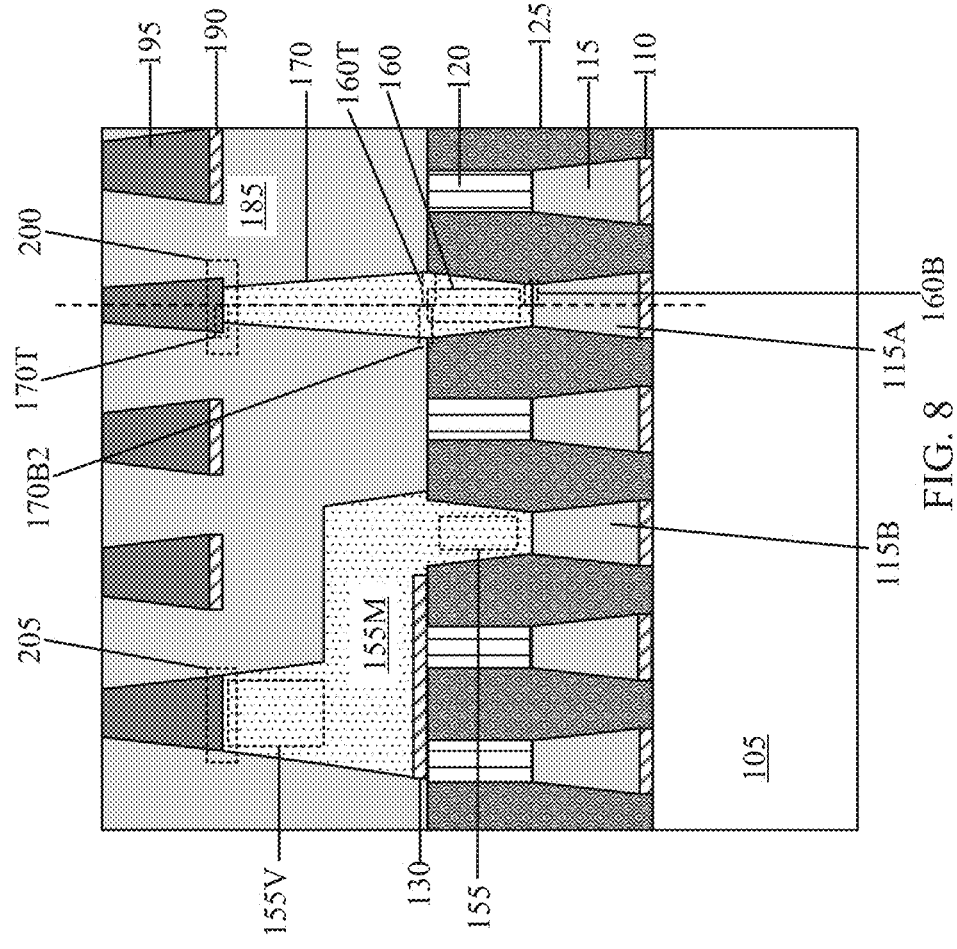
FIG. 8 illustrates a cross section view after formation of a second interlayer dielectric layer and a plurality of upper metal lines, in accordance with the embodiment of the present invention.

FIG. 4 illustrates a cross section view after an initial pattering of the second metal layer 150, in accordance with the embodiment of the present invention. A second hardmask 175 is formed on top of the second metal layer 150. The second hardmask 175 and the second metal layer 150 are patterned to form a top section 170 of the skip-via and a middle metal line 155M. The top section 170 of the skip-via and a middle metal line 155M are formed through a subtractive etching process of the second metal layer 150. The subtractive etching process forms the top section 170 of the skip-via having sidewalls that mirror the sidewalls of the bottom section 160 of the skip-via. The sidewalls of the top section 170 are angled towards the center line of the skip-via as the sidewalls extend up the skip-via. A bottom surface of the top section 170 is connected to the top surface of the bottom section 160 of the skip-via. The bottom section 170B of the top section 170 of the skip via has a fifth width when measured from the center of the bottom section 170B to the sidewall. The top section 170T of the top section 170 of the skip-via has a sixth width when measured from the center of the top section 170 of the skip-via to the sidewall. The fifth width is larger than the sixth width, which means that the width of the top section 170 of the skip-via narrows from the bottom section 170B to the top section 170T. The varying width of the top section 170 of the skip-via is achieved by the angled sidewalls, such that the sidewall is angled towards the center line of the skip-via as the sidewall extends up the top section 170 of the skip via. The fifth width is larger than the fourth width as illustrated by FIG. 4, alternatively, the fifth width can be substantially equal to the fourth width as illustrated by FIG. 8 (which will be described in further detail below).

Figure 5:
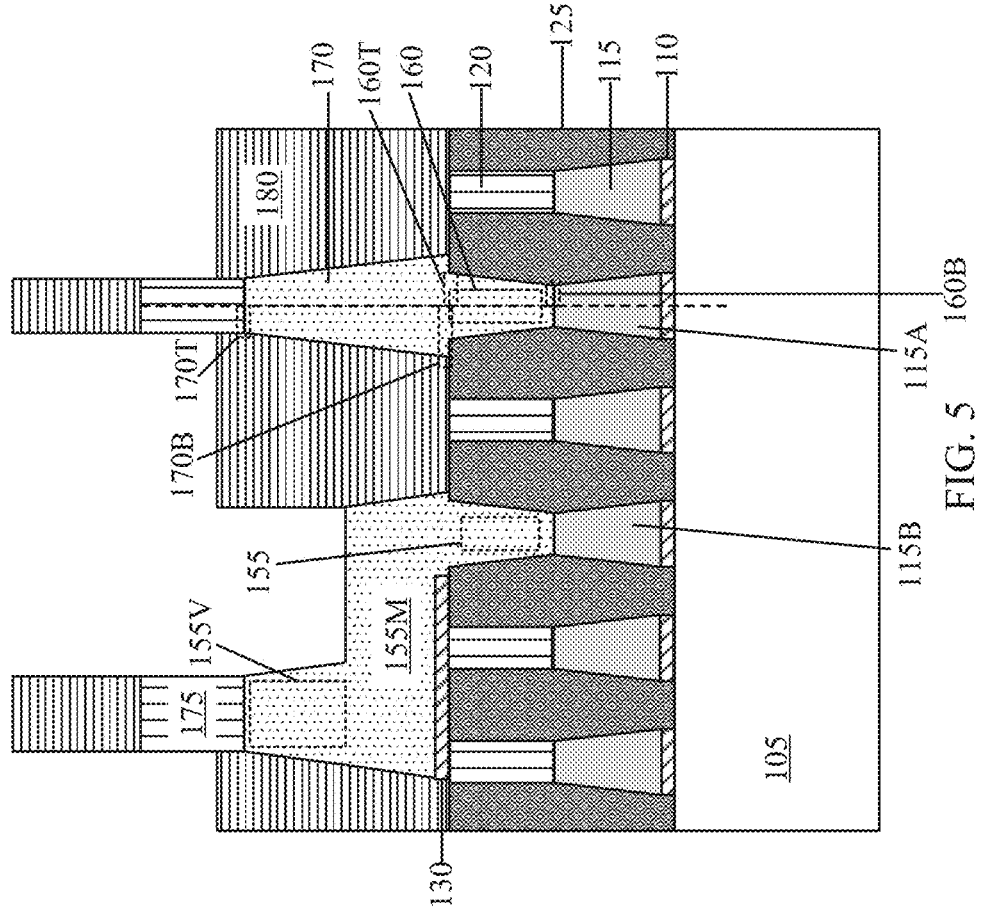
FIG. 5 illustrates a cross section view after formation and pattering of a second lithography layer, in accordance with the embodiment of the present invention.

FIG. 5 illustrates a cross section after formation and pattering of a second lithography layer, in accordance with the embodiment of the present invention. A second lithography layer 180 is formed on the exposed surfaces of the first interlayer dielectric layer 125, on top of the second hardmask 175, on the exposed surfaces of the top section 170 of the skip-via, and on the exposed surfaces of the middle metal line 155M. The second lithography layer 180 is patterned and the middle metal line 155M is also patterned to form an upper via 155V out of the of the middle metal line 155M. The second lithography layer 180 protects the skip-via from being etched during the formation of the upper via 155V.

Figure 6:
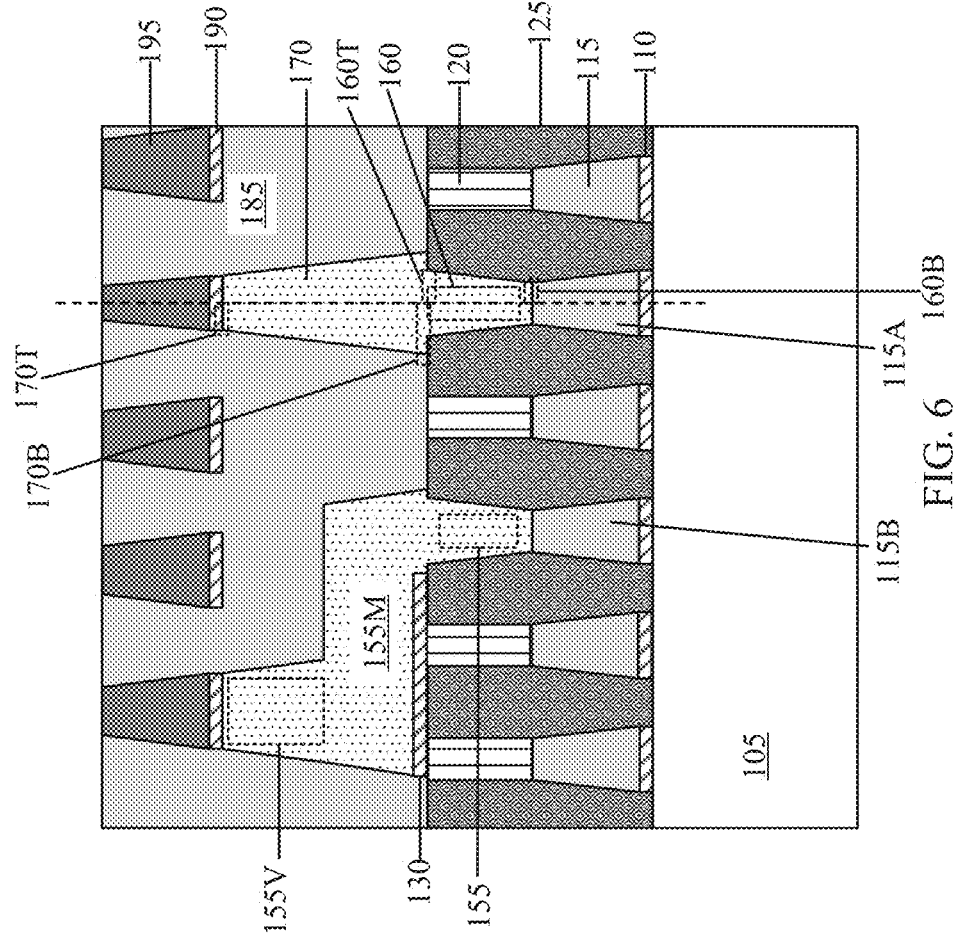
FIG. 6 illustrates a cross section view after formation of a second interlayer dielectric layer and a plurality of upper metal lines, in accordance with the embodiment of the present invention.

FIG. 6 illustrates a cross section after formation of a second interlayer dielectric layer 185 and a plurality of upper metal lines 195, in accordance with the embodiment of the present invention. The second lithography layer 180

Figure 7:
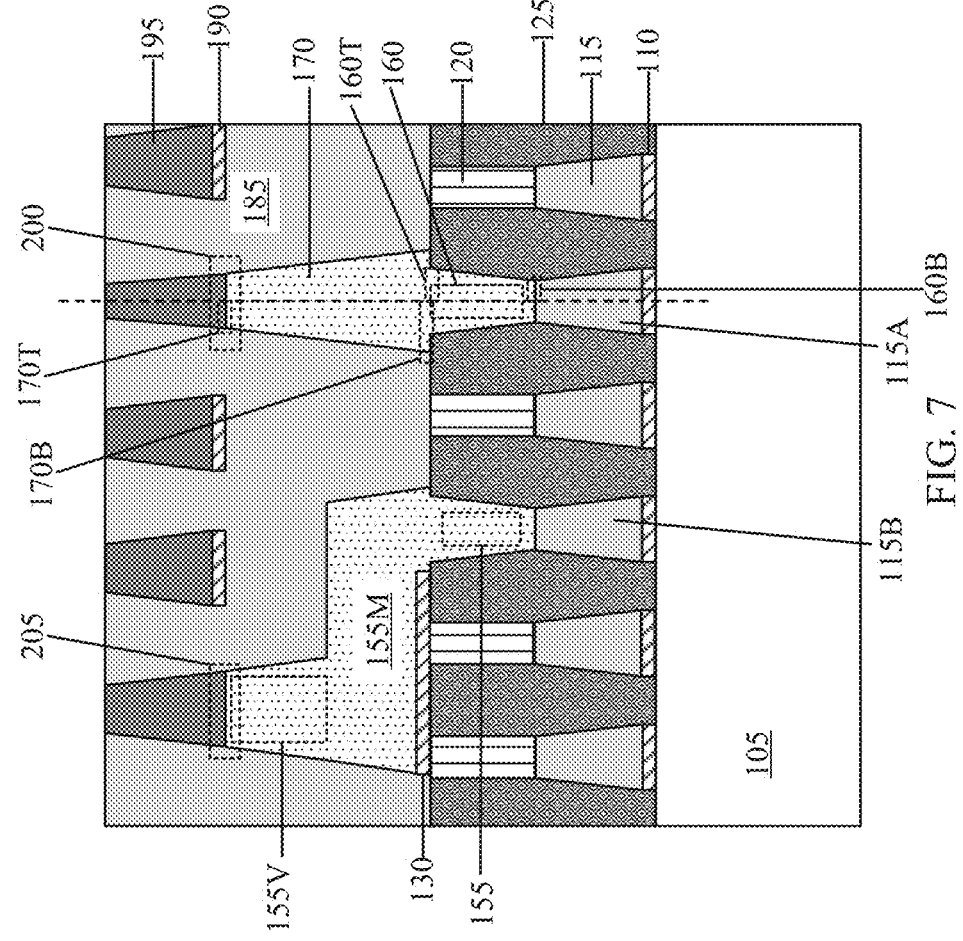
FIG. 7 illustrates a cross section view after formation of a second interlayer dielectric layer and a plurality of upper metal lines, in accordance with the embodiment of the present invention.

8 is removed and a second interlayer dielectric layer 185 is formed around the exposed surfaces of the top section 170 of the skip via, around the upper via 155V and the middle metal line 155M. An adhesion metal liner 190 is formed on top of the second interlayer dielectric layer 185 and on the exposed top surface of the upper via 155V and the top surface of the top section 170 of the skip-via. A third metal layer (not shown) is formed on top of the adhesion metal liner 190. A plurality of upper metal lines 195 are formed out of the third metal layer by a subtractive etching process. A portion of the adhesion metal liner 190 remains between the top surface of the top section 170 of the skip-via and an upper metal line 195. The sidewalls of the bottom section 160 and the top section 170 of the skip via are in contact with the first interlayer dielectric layer 125 and the second interlayer dielectric layer 185, respectively. A liner is not present between the sidewalls of the skip-via and the interlayer dielectric layers 125, 185. The skip-via without the liner leads to a reduction of the resistance skip-via when compared to the resistance of a skip-via where a liner is present between the skip-via and the surrounding materials. Furthermore, the bottom section 160 and the top section 170 of the skip via have a diamond shape profile, such that where the top section 170 and the bottom section 160 meet together is the widest portion of the skip-via. Additional second interlayer dielectric material is formed around the upper metal lines 195. The structure of FIG. 7 is substantially similar to the structure of FIG. 6, except that the adhesion metal liner 190 is not located between the upper metal lines 195 and the upper via 155V or the top surface of the top section 170 of the skip via. Dashed box 200 emphasizes where the adhesion metal liner 190 is not located. The structure of FIG. 8 is substantially similar to the structure of FIG. 6, except illustrating that the bottom section 170B2 of the top section 170 of the skip via has a width substantially equal to the width of the top section 160T of the bottom section 160 of the skip-via.

Figure 9:
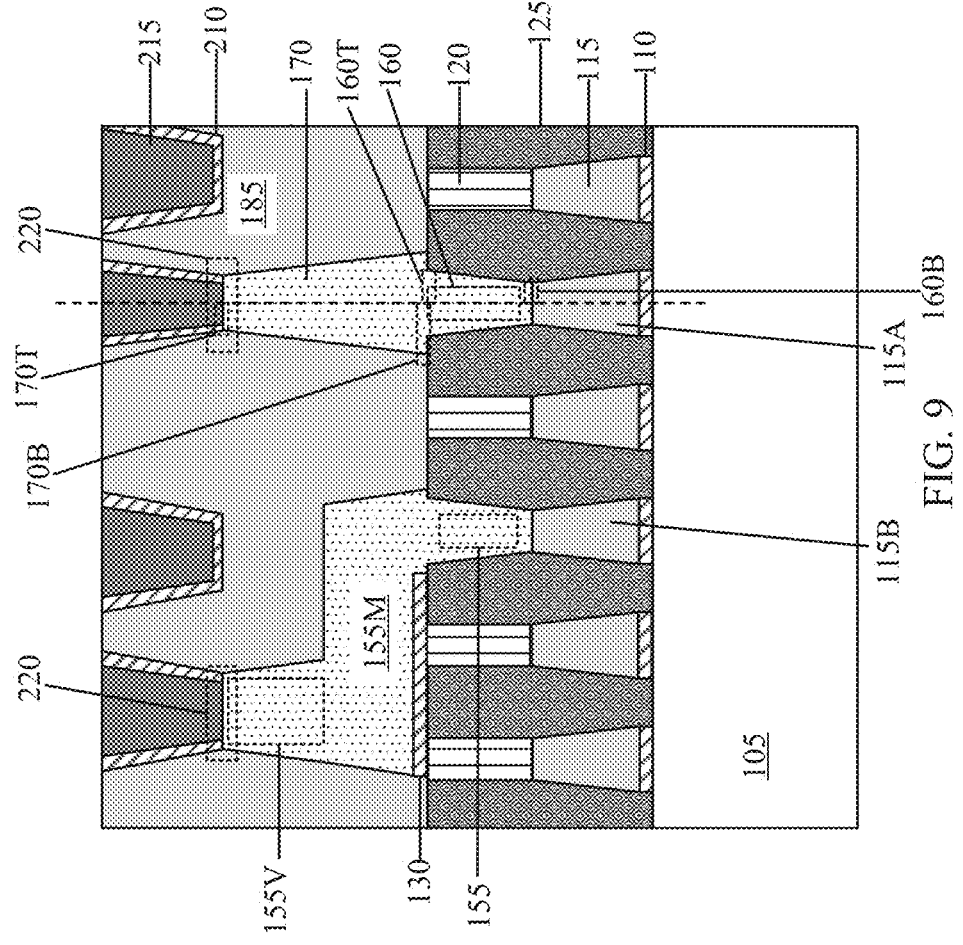
FIG. 9 illustrates a cross section view after formation of a second interlayer dielectric layer and a plurality of upper metal lines, in accordance with the embodiment of the present invention.
Figure 10:
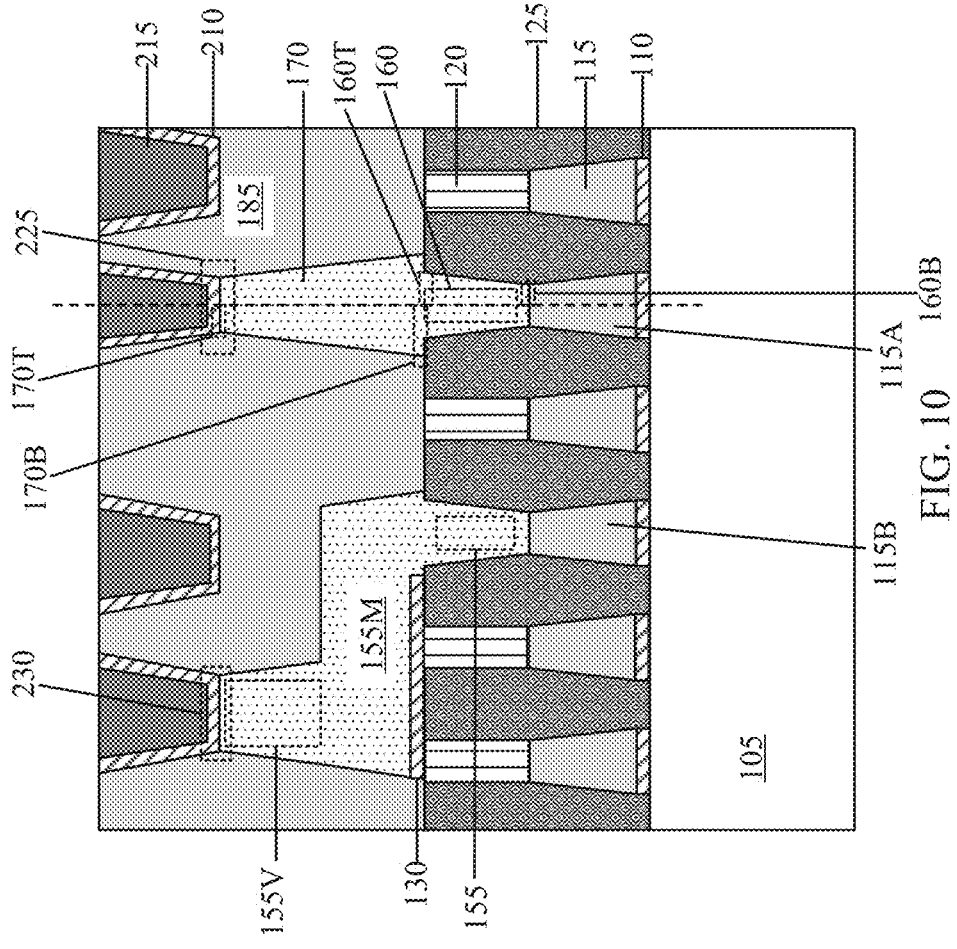
FIG. 10 illustrates a cross section view after formation of a second interlayer dielectric layer and a plurality of upper metal lines, in accordance with the embodiment of the present invention.

FIG. 9 illustrates a cross section after formation of a second interlayer dielectric layer 185, and a plurality of upper metal lines 215, in accordance with the embodiment of the present invention. The second lithography layer 180 is removed and a second interlayer dielectric layer 185 is formed around the exposed surfaces of the top section 170 of the skip via, around the upper via 155V and the middle metal line 155M. The second interlayer dielectric layer 185 is located on top of the top section 170 of the skip-via and on top of the upper via 155V. Trenches (not shown) are formed in the second interlayer dielectric layer 185 and a trench liner 210 is formed in trenches. Portions of the trench liner 210 are removed to expose a top surface of the top section 170 of the skip-via and a top surface of the upper via 155V. The trenches are filled with a metal layer to form a plurality of upper metal lines 215. The structure of FIG. 10 is substantially similar to the structure of FIG. 9, except the trench liner 210 is located between the upper metal line 215 and the upper via 155V and the top surface of the top section 170 of the skip-via, respectively.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
a first metal line, a second metal line, and a third metal line;
a skip-via connecting the first metal line to the third metal line, wherein the skip-via includes a bottom section and a top section, wherein a bottom sidewall of the bottom section is at a first angle and a top sidewall of the top section are at a second angle, wherein the first angle and the second angle are opposite from each other; and
an interlayer dielectric layer located around the first metal line and the bottom section of the skip via, wherein a bottom surface of the top section of the skip via is in contact with a top surface of the interlayer dielectric layer.

2. The microelectronic structure of claim 1, wherein a cross-section of the skip via has a diamond shape profile.

3. The microelectronic structure of the claim 1, wherein the bottom section of the skip-via has a bottom surface in contact with the first metal line, wherein the bottom surface has a first width.

4. The microelectronic structure of claim 3, wherein the bottom section of the skip-via has a top surface in contact with a bottom surface of the top section of the skip-via, wherein the top surface of the bottom section has a second width.

5. The microelectronic structure of claim 4, wherein the second width is larger than the first width.

6. The microelectronic structure of the claim 5, wherein the top section of the skip-via has a bottom surface in contact with top surface of the bottom section of the skip via, wherein the bottom surface of the top section has a third width.

7. The microelectronic structure of claim 6, wherein the top section of the skip-via has a top surface connected with a bottom surface of the third metal line, wherein the top surface of the top section has a fourth width.

8. The microelectronic structure of claim 7, wherein the third width is larger than the fourth width.

9. The microelectronic structure of claim 7, wherein the third width is larger than the second width.

10. The microelectronic structure of claim 7, wherein the third width is substantially equal to the second width.

11. The microelectronic structure of claim 1, wherein the first angle of bottom sidewalls of the bottom section of skip-via are angled away from a center line of the skip-via as the bottom sidewalls extend vertically up the bottom section of the skip-via.

12. The microelectronic structure of claim 2, wherein the second angle of top sidewalls of the top section of skip-via are angled towards the center line of the skip-via as the top sidewalls extend vertically up the top section of the skip-via.

13. A microelectronic device comprising:
a first metal line, a second metal line, and a third metal line;
a skip-via connecting the first metal line to the third metal line, wherein the skip-via includes a bottom section and a top section, wherein a bottom sidewall of the bottom section is at a first angle and a top sidewall of the top section are at a second angle, wherein the first angle and the second angle are opposite from each other;

an interlayer dielectric layer located around the first metal line and the bottom section of the skip via, wherein a bottom surface of the top section of the skip via is in contact with a top surface of the interlayer dielectric layer; and a liner located between the third metal line and the top section of the skip via.

14. The microelectronic device of the claim 13, wherein the bottom section of the skip-via has a bottom surface in contact with the first metal line, wherein the bottom surface has a first width, wherein the bottom section of the skip-via has a top surface in contact with a bottom surface of the top section of the skip-via, and wherein the top surface of the bottom section has a second width.

15. The microelectronic device of the claim 14, wherein the top section of the skip-via has a bottom surface in contact with top surface of the bottom section of the skip via, wherein the bottom surface of the top section has a third width, wherein the top section of the skip-via has a top surface connected with a bottom surface of the liner, and wherein the top surface of the top section has a fourth width.

16. The microelectronic device of claim 15, wherein the second width is larger than the first width, and wherein the third width is larger than the fourth width.

17. The microelectronic device of claim 16, wherein the third width is larger than the second width.

18. The microelectronic device of claim 17, wherein the third width is substantially equal to the second width.

19. A method comprising:

forming a first metal line;

forming an interlayer dielectric layer located around the first metal line;

forming a second metal layer and patterning the second metal layer to form a second metal line and a skip-via; and forming a third metal line; and wherein the skip-via connects the first metal line to the third metal line, wherein the skip-via includes a bottom section and a top section, wherein a bottom sidewall of the bottom section is at a first angle and a top sidewall of the top section are at a second angle, wherein the first angle and the second angle are opposite from each other, wherein the interlayer dielectric layer is located around the bottom section of the skip via, wherein a bottom surface of the top section of the skip via is in contact with a top surface of the interlayer dielectric layer.

20. The method of claim 19, wherein a cross-section of the skip via has a diamond shape profile.

* * * * *